(12) United States Patent
Huang et al.

(10) Patent No.: US 10,881,028 B1
(45) Date of Patent: Dec. 29, 2020

(54) EFFICIENT HEAT REMOVAL FROM ELECTRONIC MODULES

(71) Applicant: APPLE INC., Cupertino, CA (US)

(72) Inventors: Lidu Huang, Danville, CA (US); Alaa Al-okaily, Santa Clara, CA (US); Anuranjini Pragada, San Jose, CA (US); Colleen F Mischke, Sunnyvale, CA (US); Derek J Iredale, Campbell, CA (US); Michael R Monson, San Jose, CA (US); Nagarajan Kalyanasundaram, Los Gatos, CA (US); Peng Chen, Fremont, CA (US); Pierre P Souloumiac, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/502,059

(22) Filed: Jul. 3, 2019

(51) Int. Cl.
  *H05K 7/20* (2006.01)
  *G03B 17/55* (2006.01)
  *H04M 1/02* (2006.01)
  *G03B 15/03* (2006.01)

(52) U.S. Cl.
  CPC ......... *H05K 7/20509* (2013.01); *G03B 17/55* (2013.01); *H04M 1/026* (2013.01); *H05K 7/20418* (2013.01); *H05K 7/20454* (2013.01); *G03B 15/03* (2013.01)

(58) Field of Classification Search
  CPC .... H04N 5/22521; H04N 5/225; H04N 5/232; H04N 5/2254; H04N 5/2252; H04N 5/2253; H05K 7/2039; H05K 7/20436–20545; G03B 17/55; G03B 15/03

USPC ........ 361/702, 704, 707, 697, 709–711, 715, 361/719–720, 730, 679.54; 165/80.2–80.3; 257/712–713
  See application file for complete search history.

(56) References Cited

U.S. PATENT DOCUMENTS

| | | | |
|---|---|---|---|
| 4,069,463 | A | 1/1978 | McGroddy et al. |
| 5,812,571 | A | 9/1998 | Peters |
| 6,156,980 | A | 12/2000 | Peugh et al. |
| 6,597,713 | B2 | 7/2003 | Ouchi |
| 6,625,028 | B1 | 9/2003 | Dove et al. |

(Continued)

FOREIGN PATENT DOCUMENTS

| | | |
|---|---|---|
| CN | 110867724 A | 3/2020 |
| CN | 210224593 U | 3/2020 |

(Continued)

*Primary Examiner* — Zachary Pape
*Assistant Examiner* — Amir A Jalali
(74) *Attorney, Agent, or Firm* — Kligler & Associates Patent Attorneys Ltd

(57) ABSTRACT

An electronic module includes an operational subunit, having upper, lower and lateral surfaces, and including one or more electronic components, which are adjacent to the lower surface of the operational subunit and generate heat when the module is in operation. A heat sink is disposed in proximity to the lower surface of the operational subunit. A heat spreader, including a continuous sheet of a heat-conducting material, is folded to wrap around the operational subunit so that a lower side of the sheet is interposed between the lower surface of the operational subunit and the heat sink and a lateral side of the sheet extends around at least one of the lateral surfaces of the operational subunit.

13 Claims, 4 Drawing Sheets

(56) References Cited

U.S. PATENT DOCUMENTS

| | | | |
|---|---|---|---|
| 6,674,948 | B2 | 1/2004 | Yeh et al. |
| 6,936,855 | B1 | 8/2005 | Harrah |
| 7,126,218 | B1 | 10/2006 | Darveaux et al. |
| 7,271,461 | B2 | 9/2007 | Dutta |
| 7,303,005 | B2 | 12/2007 | Reis et al. |
| 7,800,067 | B1 | 9/2010 | Rajavel et al. |
| 7,949,024 | B2 | 5/2011 | Joseph |
| 8,193,482 | B2 | 6/2012 | Itsler |
| 8,259,293 | B2 | 9/2012 | Andreou |
| 8,275,270 | B2 | 9/2012 | Ishushakov et al. |
| 8,355,117 | B2 | 1/2013 | Niclass |
| 8,405,020 | B2 | 3/2013 | Menge |
| 8,604,603 | B2 | 12/2013 | Lau et al. |
| 8,766,164 | B2 | 7/2014 | Sanfilippo et al. |
| 8,963,069 | B2 | 2/2015 | Drader et al. |
| 9,024,246 | B2 | 5/2015 | Jiang et al. |
| 9,052,356 | B2 | 6/2015 | Chu et al. |
| 9,076,707 | B2 | 7/2015 | Harmon |
| 9,106,849 | B2 | 8/2015 | Duggal et al. |
| 9,430,006 | B1 * | 8/2016 | Hayashida ................. G06F 1/20 |
| 9,735,539 | B2 | 8/2017 | Jiang et al. |
| 9,819,144 | B2 | 11/2017 | Lin et al. |
| 10,034,375 | B2 | 7/2018 | Pyper et al. |
| 10,103,512 | B2 | 10/2018 | Jiang et al. |
| 10,454,241 | B2 | 10/2019 | Jiang et al. |
| 10,470,307 | B2 | 11/2019 | Pyper et al. |
| 10,551,886 | B1 * | 2/2020 | de la Fuente ...... H05K 7/20963 |
| 2002/0070443 | A1 | 6/2002 | Mu et al. |
| 2002/0127752 | A1 | 9/2002 | Thompson et al. |
| 2002/0176459 | A1 | 11/2002 | Martinsen |
| 2003/0081385 | A1 | 5/2003 | Mochizuki et al. |
| 2004/0001317 | A1 | 1/2004 | Getz, Jr. et al. |
| 2004/0180470 | A1 | 9/2004 | Romano et al. |
| 2007/0262441 | A1 | 11/2007 | Chen |
| 2010/0164079 | A1 | 7/2010 | Dekker et al. |
| 2011/0026264 | A1 | 2/2011 | Reed et al. |
| 2012/0051384 | A1 | 3/2012 | Geske et al. |
| 2013/0015331 | A1 | 1/2013 | Birk et al. |
| 2013/0163627 | A1 | 6/2013 | Seurin |
| 2013/0342835 | A1 | 12/2013 | Blacksberg |
| 2014/0231630 | A1 | 8/2014 | Rae et al. |
| 2014/0348192 | A1 | 11/2014 | Pruijmboom et al. |
| 2014/0353471 | A1 | 12/2014 | Raynor et al. |
| 2015/0092802 | A1 | 4/2015 | Gronenborn et al. |
| 2015/0163429 | A1 | 6/2015 | Dai et al. |
| 2015/0195956 | A1 * | 7/2015 | Linderman ........ H05K 7/20472 363/141 |
| 2015/0200222 | A1 | 7/2015 | Webster |
| 2015/0200314 | A1 | 7/2015 | Webster |
| 2015/0255955 | A1 | 9/2015 | Wang et al. |
| 2015/0342023 | A1 | 11/2015 | Refai-Ahmed et al. |
| 2015/0348865 | A1 * | 12/2015 | Vincent ................... H01L 24/03 257/712 |
| 2016/0300825 | A1 | 10/2016 | Hoeppel |
| 2018/0092241 | A1 * | 3/2018 | Rasmussen ........ H01R 12/7076 |
| 2018/0092253 | A1 * | 3/2018 | Qiu ........................ H05K 1/181 |
| 2018/0239105 | A1 * | 8/2018 | Lee ........................ G03B 17/55 |
| 2018/0310407 | A1 | 10/2018 | Pyper et al. |
| 2019/0264890 | A1 | 8/2019 | Chang et al. |
| 2019/0324223 | A1 | 10/2019 | Yim et al. |
| 2019/0326731 | A1 | 10/2019 | Mathai et al. |
| 2019/0381939 | A1 * | 12/2019 | Rafalowski ............ G03B 17/55 |

FOREIGN PATENT DOCUMENTS

| | | |
|---|---|---|
| WO | 2019149778 A1 | 8/2019 |
| WO | 2020074351 A1 | 4/2020 |

* cited by examiner

EFFICIENT HEAT REMOVAL FROM ELECTRONIC MODULES

FIELD OF THE INVENTION

The present invention relates generally to design and production of electronic modules, and particularly to methods and components for enhancing heat dissipation from such modules.

BACKGROUND

Mobile electronic devices, such as smartphones, are packed densely with electronic modules. All of these modules generate heat, and some—such as a camera module with an integrated illumination source—can generate a great deal of heat in a small volume. Careful thermal design is needed in order to ensure that temperatures within the device do not exceed designed operating limits.

For this reason, high-power electronic modules are commonly mounted on a heat sink, comprising a material with high thermal conductivity and high thermal mass, which absorbs heat from the components of the module and transfers the heat efficiently to a fluid medium (such as the air). When the heat source within the electronic module is small and has a high heat-flux density, a heat spreader may be used to increase the rate of heat transfer between the heat source and the heat sink. The heat spreader comprises a sheet or block of material with high thermal conductivity, which absorbs heat in a small area from the heat source and spreads the heat over a larger area, at least part of which is in contact with the heat sink.

SUMMARY

Embodiments of the present invention that are described hereinbelow provide electronic modules with improved heat dissipation, and well as devices and methods for use in producing such modules.

There is therefore provided, in accordance with an embodiment of the invention, an electronic module, which includes an operational subunit, having upper, lower and lateral surfaces, and including one or more electronic components, which are adjacent to the lower surface of the operational subunit and generate heat when the module is in operation. A heat sink is disposed in proximity to the lower surface of the operational subunit. A heat spreader, including a continuous sheet of a heat-conducting material, is folded to wrap around the operational subunit so that a lower side of the sheet is interposed between the lower surface of the operational subunit and the heat sink and a lateral side of the sheet extends around at least one of the lateral surfaces of the operational subunit.

In a disclosed embodiment, the heat-conducting material comprises graphite. Additionally or alternatively, the heat-conducting material comprises a flexible foil.

In one embodiment, the one or more electronic components comprise a light source.

In some embodiments, the sheet of the heat-conducting material is folded so that an upper side of the sheet overlies the upper surface of the operational subunit. In a disclosed embodiment, the sheet of the heat-conducting material is folded into a U-shape, which wraps around the operational subunit.

There is also provided, in accordance with an embodiment of the invention, an electronic device, including a backplate and the module as described above, which is mounted in the device with the heat sink in thermal contact with the backplate, such that a first part of the heat generated in the operational subunit is conducted through the heat spreader and heat sink to the backplate. A cover fits over the backplate and contains the module, such that a second part of the heat generated in the operational subunit is dissipated from the upper side of the heat spreader through the cover.

There is additionally provided, in accordance with an embodiment of the invention, a method for producing an electronic module. The method includes providing an operational subunit, having upper and lower surfaces, and including one or more electronic components, which are adjacent to the lower surface of the operational subunit and generate heat when the module is in operation. A heat spreader, including a continuous sheet of a heat-conducting material, is wrapped around the operational subunit so that a lower side of the sheet covers the lower surface of the operational subunit, and an upper side of the sheet overlies the upper surface of the operational subunit. The lower side of the sheet is fixed to a heat sink.

In some embodiments, wrapping the heat spreader includes folding the sheet of the heat-conducting material so that an upper side of the sheet overlies the upper surface of the operational subunit. In one embodiment, the sheet of the heat-conducting material is folded into a U-shape, which wraps around the operational subunit.

The present invention will be more fully understood from the following detailed description of the embodiments thereof, taken together with the drawings in which:

DETAILED DESCRIPTION OF EMBODIMENTS

Mobile devices, such as smartphones, contain electronic components that generate substantial amounts of heat relative to their small volume. As an example of such components, a camera module in the device may comprise a high-power light source, such as a light-emitting diode (LED) or laser diode. This heat must be dissipated effectively to ensure proper device operation, as well as to avoid shortened device lifetime that can occur due to overheating. Severe overheating can happen very suddenly when the thermal path through which heat is dissipated from the heat-generating module is interrupted, for example due to a mechanical fault.

Embodiments of the present invention that are described herein address these problems by providing a module design that supports redundant thermal paths. Specifically, in the disclosed embodiments, a novel heat spreader is wrapped around an electronic module so as to evacuate heat from multiple different surfaces of the module. The heat spreader thus creates multiple thermal paths, one of which may operate by conduction of heat to a heat sink, for example, while another path operates by convection and/or conduction through another part of the electronic device in which the module is installed. The creation of multiple thermal paths in this manner provides more effective heat dissipation, so that the normal operating temperature of the module can be reduced, and also offers a failsafe against rapid overheating in the event that one of the thermal paths is broken.

In the disclosed embodiments, an electronic module comprises an operational subunit, which contains one or more electronic components that generate heat when the module is in operation. These components are assumed to be adjacent to the lower surface of the operational subunit, which is positioned in proximity to a heat sink. A heat spreader, comprising a continuous sheet of a heat-conducting material, wraps around the operational subunit, so that a lower side of the sheet is interposed between the lower surface of the operational subunit and the heat sink, while a lateral side of the sheet extends around at least one of the lateral surfaces of the operational subunit. In some embodiments, the heat spreader sheet is folded, possibly into a U-shape, so that the upper side of the sheet overlies the upper surface of the operational subunit.

The terms "upper" and "lower" are used arbitrarily, for the sake of convenience in the present description and in the claims, to identify the opposing sides of the electronic module from which heat is to be removed. Typically, such modules will operate in any orientation, meaning that in use, the "lower" side may be facing upward or sideways.

In some embodiments of the present invention, the heat spreader comprises a graphite sheet, which is a good heat conductor and has the added advantage that it conducts heat well through folds in the sheet. Additionally or alternatively, the heat spreader may comprise a flexible foil.

Figure 1:
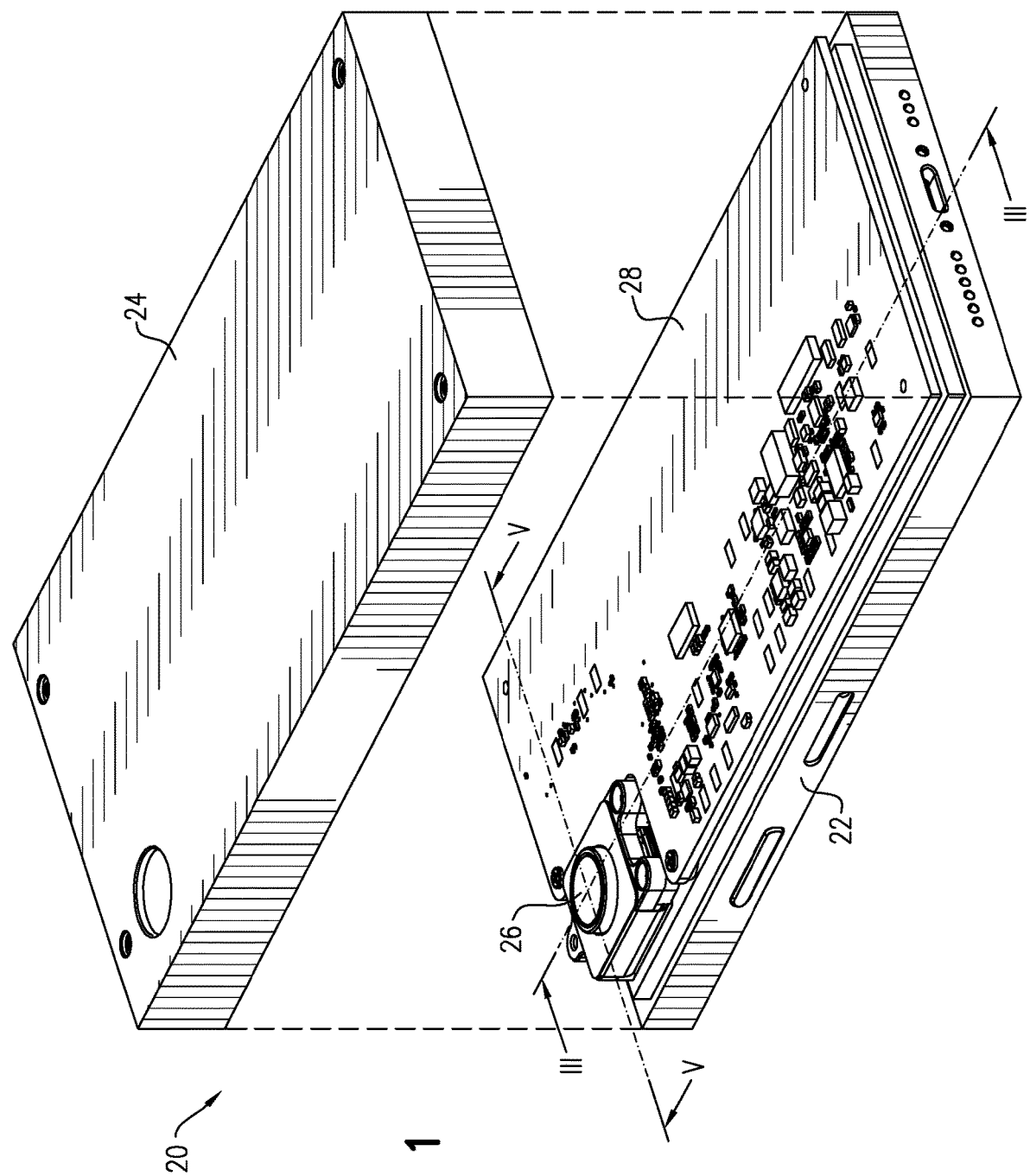
FIG. 1 is schematic pictorial view of a mobile electronic device, in accordance with an embodiment of the invention.

FIG. 1 is schematic pictorial view of a mobile electronic device 20, in accordance with an embodiment of the invention. Device 20 comprises a case 22, containing components such as communication circuits, a display and a battery (not shown in the figures), overlaid by a backplate (shown in FIGS. 3 and 5). An electronic module is mounted in device 20, and is connected to an auxiliary circuit board 28 in the pictured example. A cover 24 fits over the backplate of case 22 and contains module 26.

Figure 2A:
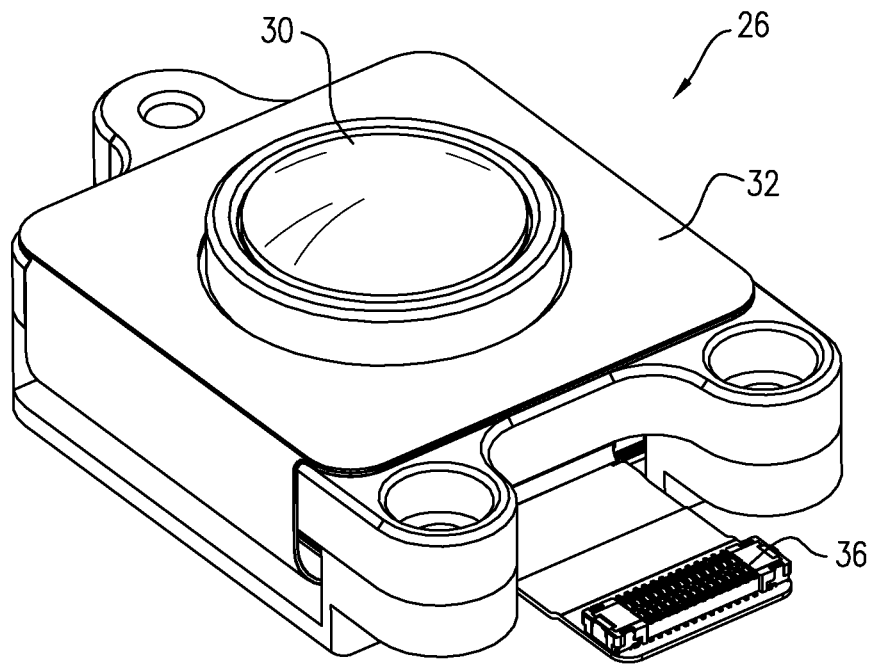
FIGS. 2A and 2B are schematic upper and lower pictorial views, respectively, of an electronic module incorporated in the device of FIG. 1, in accordance with an embodiment of the invention.
Figure 2B:
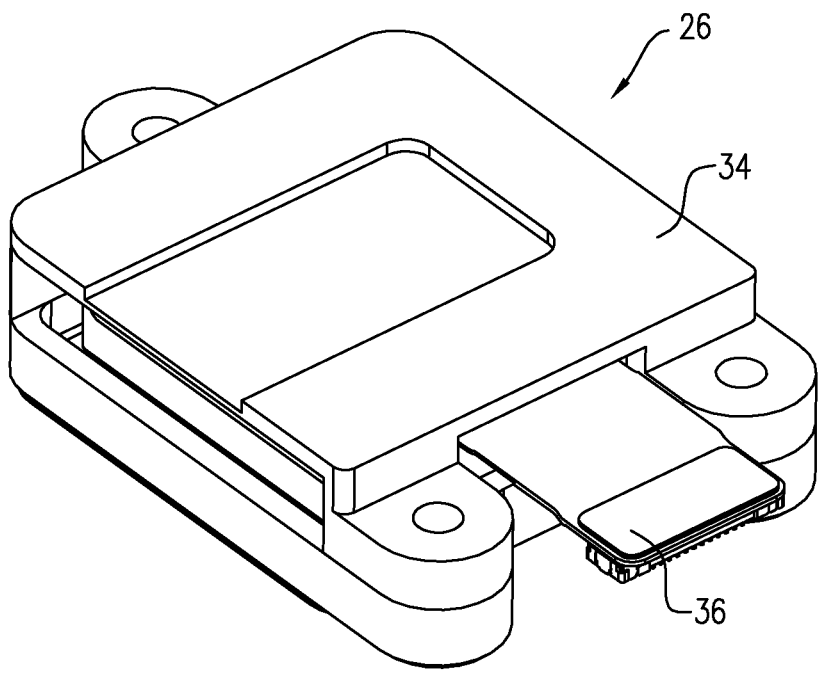

FIGS. 2A and 2B are schematic upper and lower pictorial views, respectively, of electronic module 26, in accordance with an embodiment of the invention. (Again, the terms "upper" and "lower" are used arbitrarily, for convenience of description.) In this example, module 26 is an optoelectronic module, such as a camera with a built-in illumination source. For this purpose, a window 30 opens through the upper surface of module 26. The window is surrounded by the upper side of a heat spreader 32, which is described in greater detail hereinbelow. The lower side of the heat spreader is covered by a heat sink 34, comprising a block of a metal, such as copper, or suitable ceramic material. A connector 36 is used to connect the electronic components in module 26 to auxiliary circuit board 28.

Figure 3:
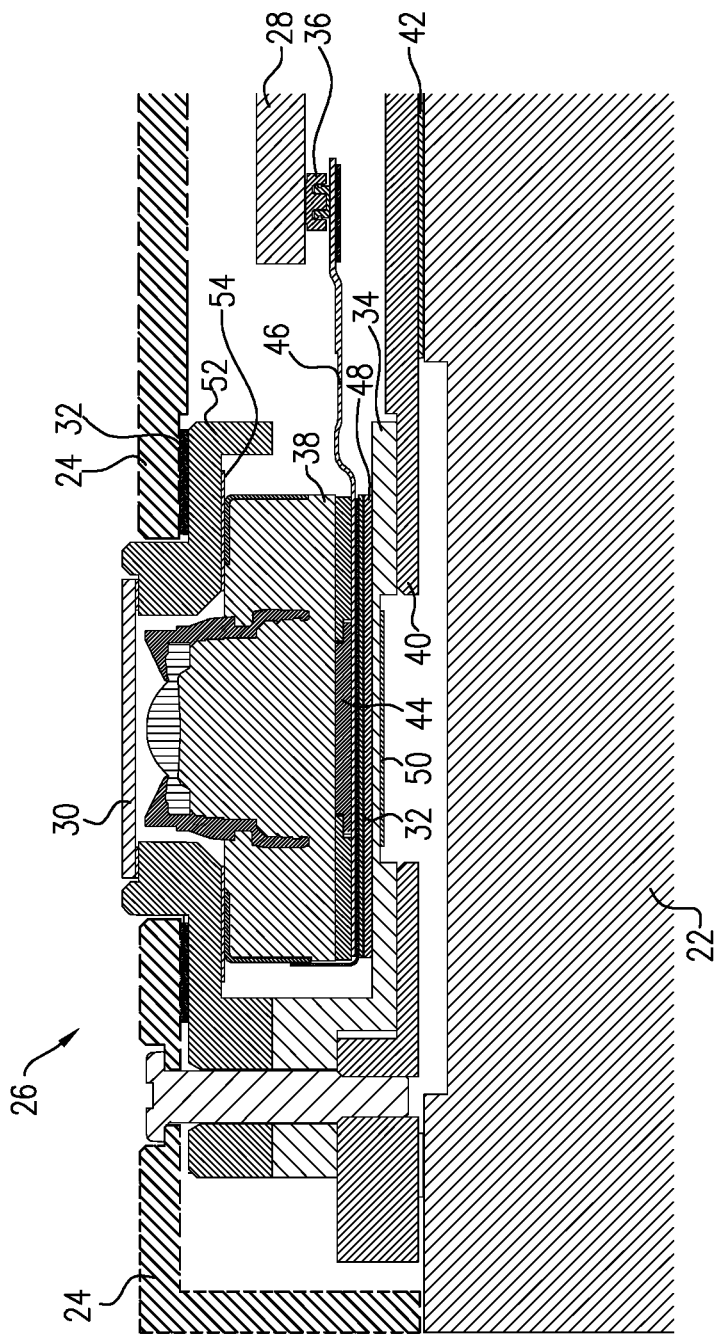
FIG. 3 is a schematic sectional view of the electronic module of FIGS. 2A/B, taken along the line labeled III-III in FIG. 1.

FIG. 3 is a schematic sectional view of electronic module 26, taken along the line labeled III-III in FIG. 1. Module 26 comprises an operational subunit 38, comprising one or more electronic components 44, which generate heat when the module is in operation. For example, operational subunit 38 may be an imaging subunit including one or more light sources, optics, and an image sensor within a housing. (The principles of the present embodiment are applicable to substantially any subunit of this sort, in which electrical components generate heat.) Components 44 are mounted on a flexible printed circuit (which extends out to connector 36), in a location adjacent to the lower surface of the operational subunit. The internal details of operational subunit 38 are not relevant to an understanding of the present invention and are omitted for the sake of simplicity.

Figure 5A:
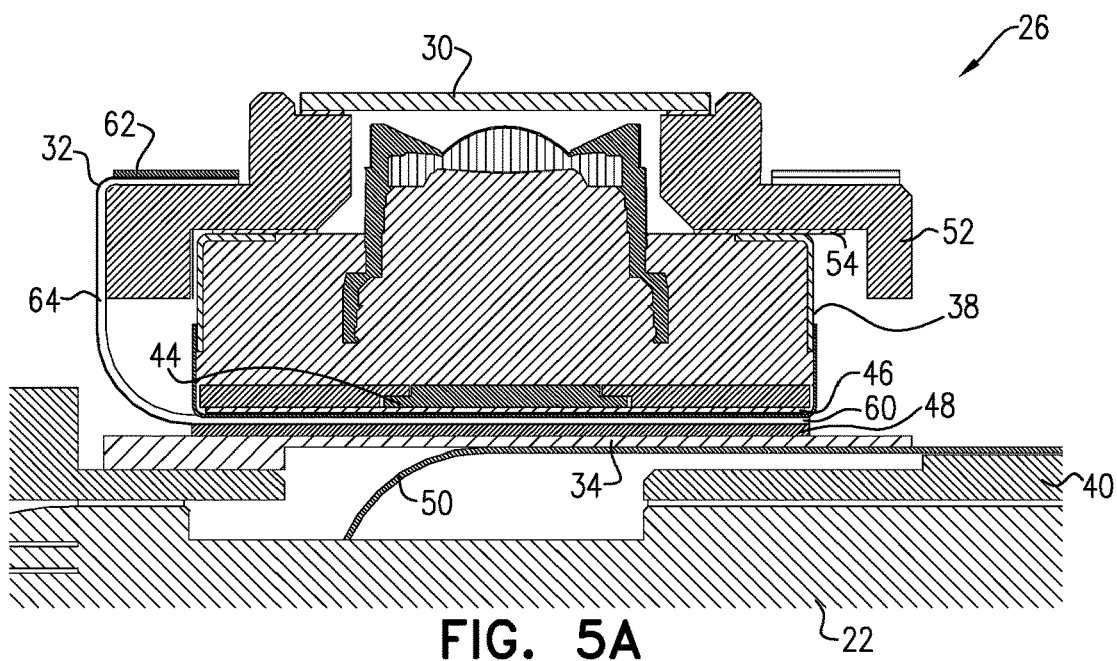
FIG. 5A is a schematic sectional view of the electronic module of FIGS. 2A/B, taken along the line labeled V-V in FIG. 1.

Heat spreader 32 is folded to wrap around operational subunit 38 (as can been seen more clearly in FIG. 5A). The lower side of the heat spreader is located below components 44, interposed between the lower surface of operational subunit 38 and heat sink 34. In the pictured example, heat spreader 32 is connected to heat sink 34 by a thermal pad 48, comprising a suitable thermally-conductive gel or epoxy, for example, in order to ensure good thermal contact between the heat spreader and the heat sink. Heat sink 34 is in thermal contact with a backplate 40 of device 20, while backplate 40 is fixed to case 22 by a suitable adhesive 42. Backplate 40 comprises a sheet of aluminum, for example, or another material with good thermal conductivity. A flexible printed circuit 50 (also seen more clearly in FIG. 5) connects module 26 to the components in case 22 (but these components and connections are beyond the scope of the present description).

A bracket 52 is fixed to the upper surface of operational subunit 38, for example by a thin layer of a suitable adhesive 54. The upper side of heat spreader 32 is folded over and fixed to the upper surface of bracket 52. Cover 24 is then fitted over bracket 52, with window 30 exposed through a corresponding opening in cover 24.

Figure 4:
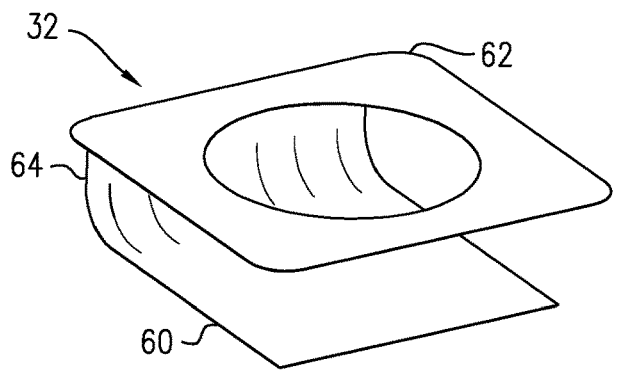
FIG. 4 is a schematic pictorial view of a heat spreader, in accordance with an embodiment of the invention.

FIG. 4 is a schematic pictorial view of heat spreader 32, in accordance with an embodiment of the invention. As noted earlier, heat spreader 32 comprises a continuous sheet of a heat-conducting material, which is folded to define a lower side 60 and an upper side 62, connected by a lateral side 64. Thus, in the pictured embodiment, heat spreader 32 is folded into a U-shape, with an opening in upper side 62 to accommodate window 30. Alternatively, the heat spreader may be folded into a different shape, for example extending only around one or more of the lateral surfaces of module 26 without covering the upper surface, or forming a sleeve that extends fully around the upper and lower surfaces and two (or more) lateral surfaces of module 26. All such folded shapes of the heat spreader are considered to be within the scope of the present invention.

As noted earlier, heat spreader 32 advantageously comprises a thin, continuous sheet of graphite, with thickness typically between 10 and 100 µm, for example 25 µm thick. (Graphite is not isotropic and has very high in-plane thermal conductivity, typically ~1000 $W \cdot m^{-1} \cdot K^{-1}$, but much lower through-plane conductivity, typically ~10 $W \cdot m^{-1} \cdot K^{-1}$.) Alternatively or additionally, heat spreader may comprise a metal foil, such as a copper or aluminum foil, which may be laminated onto or otherwise integrated with the graphite sheet. The heat spreader sheet may be backed with a thermally-conductive adhesive, which bonds the heat spreader to module 26.

Figure 5B:
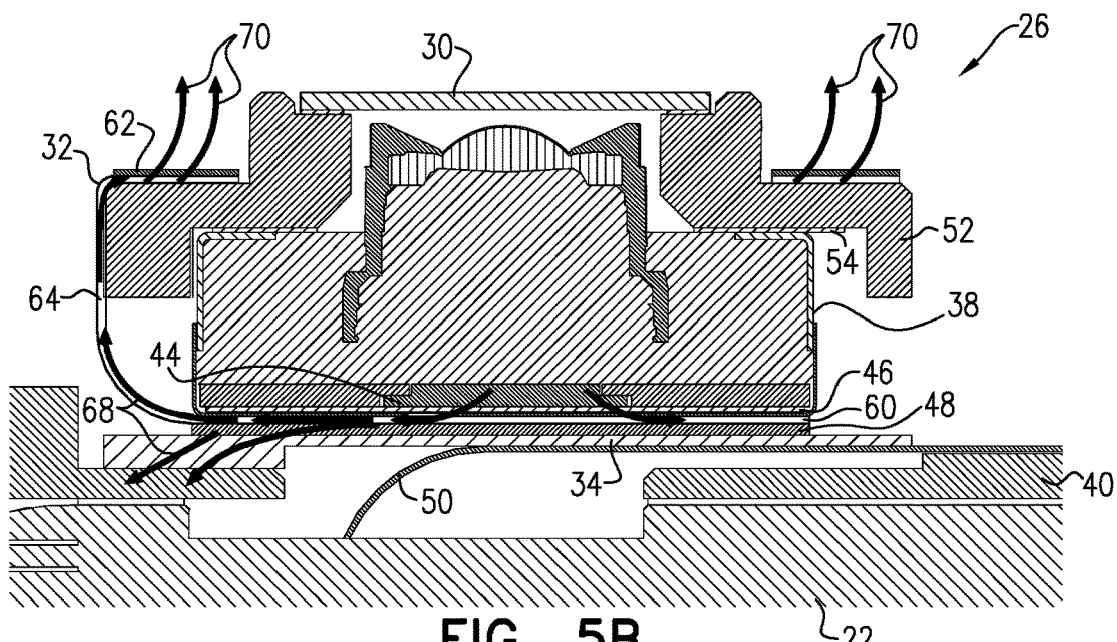
FIG. 5B schematically shows thermal paths in the sectional view of FIG. 5A.

FIGS. 5A and 5B are schematic sectional views of electronic module 26, taken along the line labeled V-V in FIG. 1. (These two views are identical, with the exception of arrows 68 and 70 shown in FIG. 5B to illustrated heat flow.) In FIG. 5A, it can be seen more clearly that lateral side 64 of heat spreader 32 extends around the lateral surface of operational subunit 38. Due to the thermal contact between lower side 60 of heat spreader 32 and heat sink 34, along with the thermal contact between heat sink 34 and backplate 40, most of the heat generated in operational subunit 38 is conducted through the heat spreader and heat sink to the backplate, as indicated by arrows 68 in FIG. 5B. The remaining heat is conducted through lateral side 64 of heat spreader 32 to upper side 62. At least a part of this remaining heat is dissipated from upper side 62 through cover 24 of device 20, as indicated by arrows 70. Arrows 68 and 70 thus illustrate the redundant thermal paths provided by heat spreader 32 for removal of excess heat from module 26.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An electronic module, comprising:
an operational subunit, having upper, lower and lateral surfaces, and comprising one or more electronic components, which are adjacent to the lower surface of the operational subunit and generate heat when the module is in operation,
wherein the operational subunit comprises an optoelectronic module having a window opening through the upper surface;
a heat sink, disposed in proximity to the lower surface of the operational subunit; and
a heat spreader, comprising a continuous sheet of a heat-conducting material, which is folded to wrap around the operational subunit so that a lower side of the sheet is interposed between the lower surface of the operational subunit and the heat sink and a lateral side of the sheet extends around at least one of the lateral surfaces of the operational subunit, and an upper side of the sheet overlies the upper surface of the operational subunit and has an opening through which the window is exposed.

2. The module according to claim 1, wherein the heat-conducting material comprises graphite.

3. The module according to claim 1, wherein the heat-conducting material comprises a flexible foil.

4. The module according to claim 1, wherein the one or more electronic components comprise a light source.

5. The module according to claim 1, wherein the sheet of the heat-conducting material is folded into a U-shape, which wraps around the operational subunit.

6. An electronic device, comprising:
a backplate;
the module according to claim 1, which is mounted in the device with the heat sink in thermal contact with the backplate, such that a first part of the heat generated in the operational subunit is conducted through the heat spreader and heat sink to the backplate; and
a cover, which fits over the backplate and contains the module, such that a second part of the heat generated in the operational subunit is dissipated from the upper side of the heat spreader through the cover.

7. A method for producing an electronic module, the method comprising:
providing an operational subunit, having upper and lower surfaces, and comprising one or more electronic components, which are adjacent to the lower surface of the operational subunit and generate heat when the module is in operation,
wherein the operational subunit comprises an optoelectronic module having a window opening through the upper surface;
wrapping a heat spreader, comprising a continuous sheet of a heat-conducting material, around the operational subunit so that a lower side of the sheet covers the lower surface of the operational subunit, and an upper side of the sheet overlies the upper surface of the operational subunit and has an opening through which the window is exposed; and
fixing the lower side of the sheet to a heat sink.

8. The method according to claim 7, wherein the heat-conducting material comprises graphite.

9. The method according to claim 7, wherein the heat-conducting material comprises a flexible foil.

10. The method according to claim 7, wherein the one or more electronic components comprise a light source.

11. The method according to claim 7, wherein wrapping the heat spreader comprises folding the sheet of the heat-conducting material so that a lateral side of the sheet extends around at least one of the lateral surfaces of the operational subunit, and the upper side of the sheet overlies the upper surface of the operational subunit.

12. The method according to claim 11, wherein the sheet of the heat-conducting material is folded into a U-shape, which wraps around the operational subunit.

13. The method according to claim 11, and comprising:
mounting the module in a device with the heat sink in thermal contact with a backplate of the device, such that a first part of the heat generated in the operational subunit is conducted through the heat spreader and heat sink to the backplate; and
fitting a cover over the backplate and contains the module, such that a second part of the heat generated in the operational subunit is dissipated from the upper side of the heat spreader through the cover.

* * * * *